US009665289B1

(12) United States Patent
Mach et al.

(10) Patent No.: US 9,665,289 B1
(45) Date of Patent: May 30, 2017

(54) EYE SCAN FOR MEMORY CHANNEL

(71) Applicant: Inphi Corporation, Santa Clara, CA (US)

(72) Inventors: Dat Tuan Mach, San Jose, CA (US); Alejandro Lopez-Sosa, Thousand Oaks, CA (US); Chao Xu, Thousand Oaks, CA (US); Chien-Hsin Lee, Santa Clara, CA (US)

(73) Assignee: INPHI CORPORATION, Santa Clara, CA (US)

( * ) Notice: Subject to any disclaimer, the term of this patent is extended or adjusted under 35 U.S.C. 154(b) by 54 days.

(21) Appl. No.: 14/959,141

(22) Filed: Dec. 4, 2015

(51) Int. Cl.
| G09F 3/06 | (2006.01) |
| G06F 3/06 | (2006.01) |
| G06F 13/16 | (2006.01) |
| G06F 13/40 | (2006.01) |
| G06F 11/27 | (2006.01) |

(52) U.S. Cl.
CPC ............ *G06F 3/061* (2013.01); *G06F 3/0604* (2013.01); *G06F 3/067* (2013.01); *G06F 3/0632* (2013.01); *G06F 11/27* (2013.01); *G06F 13/1668* (2013.01); *G06F 13/4068* (2013.01)

(58) Field of Classification Search
CPC ........................................................ G06F 3/06
See application file for complete search history.

(56) References Cited

U.S. PATENT DOCUMENTS

| 8,983,291 B1 | 3/2015 | Broekaert et al. |
| 8,990,491 B1 | 3/2015 | Xu |
| 2015/0155946 A1 | 6/2015 | Broekaert et al. |

*Primary Examiner* — David X Yi
*Assistant Examiner* — Zubair Ahmed
(74) *Attorney, Agent, or Firm* — Richard T. Ogawa; Ogawa P.C.

(57) ABSTRACT

Techniques are described for processing signal information from a high speed communication bus. The techniques include determining spatial regions on an eye by sampling a plurality of time and voltage points to determine a two-dimensional matrix. Then, the points are assigned a numerical value from combined time and voltage functions based upon a distance from eye edges (e.g., minimum setup time requirement and minimum hold time requirement along the time dimension). Sampling to generate the matrix may comprise selecting an initial point, splitting a first margin along a first dimension into equally spaced regions, and then sampling a second margin along a second dimension into equally spaced regions. Determining the points is based on shifting a strobe signal (DQS) position and a data signal (DQ) position and running a plurality of memory built-in self test (BIST) engines and a plurality of results of BIST tests.

20 Claims, 10 Drawing Sheets

EYE SCAN FOR MEMORY CHANNEL

BACKGROUND

The present invention relates to computing techniques. More particularly, the present invention provides a plurality of memory devices configured with a memory controller using a common interface bus having multiple signals. In other examples where a memory controller controls multiple memory devices, interface devices are often deployed to improve the quality of the signal transmissions between the memory controller and the memory devices. As an example, DDR3, and DDR4 Registered memory modules use one or more registers to buffer and re-drive the command, control and address signals from the host memory controller to multiple DDR3 and DDR4 SDRAM devices. DDR3, and DDR4 Load Reduction DIMM memory modules use memory buffer to buffer and re-drive the data, command, control and address signals from the host memory controller to multiple DDR3 and DDR4 SDRAM devices.

High-speed digital signals, such as the data, clock and control signals that are conveyed between a host controller and a memory module, are typically received by a respective receiver circuits. The host controller often couples to a memory controller, which is configured with multiple dual inline memory modules, commonly called "DIMMs," via a common interface. As the signals become faster, signal integrity becomes more important, and more difficult to operate and monitor efficiently.

From the above, it is seen that techniques for improving memory module devices and methods of use are highly desirable.

SUMMARY

Techniques are described for processing signal information from a high speed communication bus. The techniques include determining spatial regions on an eye by sampling a plurality of time and voltage points to determine a two-dimensional matrix. Then, the points are assigned a numerical value from combined time and voltage functions based upon a distance from eye edges (e.g., minimum setup time requirement and minimum hold time requirement along the time dimension). Sampling to generate the matrix may comprise selecting an initial point, splitting a first margin along a first dimension into equally spaced regions, and then sampling a second margin along a second dimension into equally spaced regions. Determining the points is based on shifting a strobe signal (DQS) position and a data signal (DQ) position and running a plurality of memory built-in self test (BIST) engines and a plurality of results of BIST tests.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION

This present invention relates to memory storage systems and devices. More particularly, the present invention provides a memory system and a method of operating a memory system and a memory buffer device. Merely by way of example, the invention has been provided for the application of DDR3 and DDR4 SDRAM devices, but it would be recognized that the methods described herein can be applied to other memory storage systems and the like. Additionally, such memory storage systems can be used for a variety of applications such as network and/or computer storage systems, computer servers, hand held computing devices, portable computing devices, computer systems, network appliances and/or switches, routers, and gateways, and the like.

Figure 1:
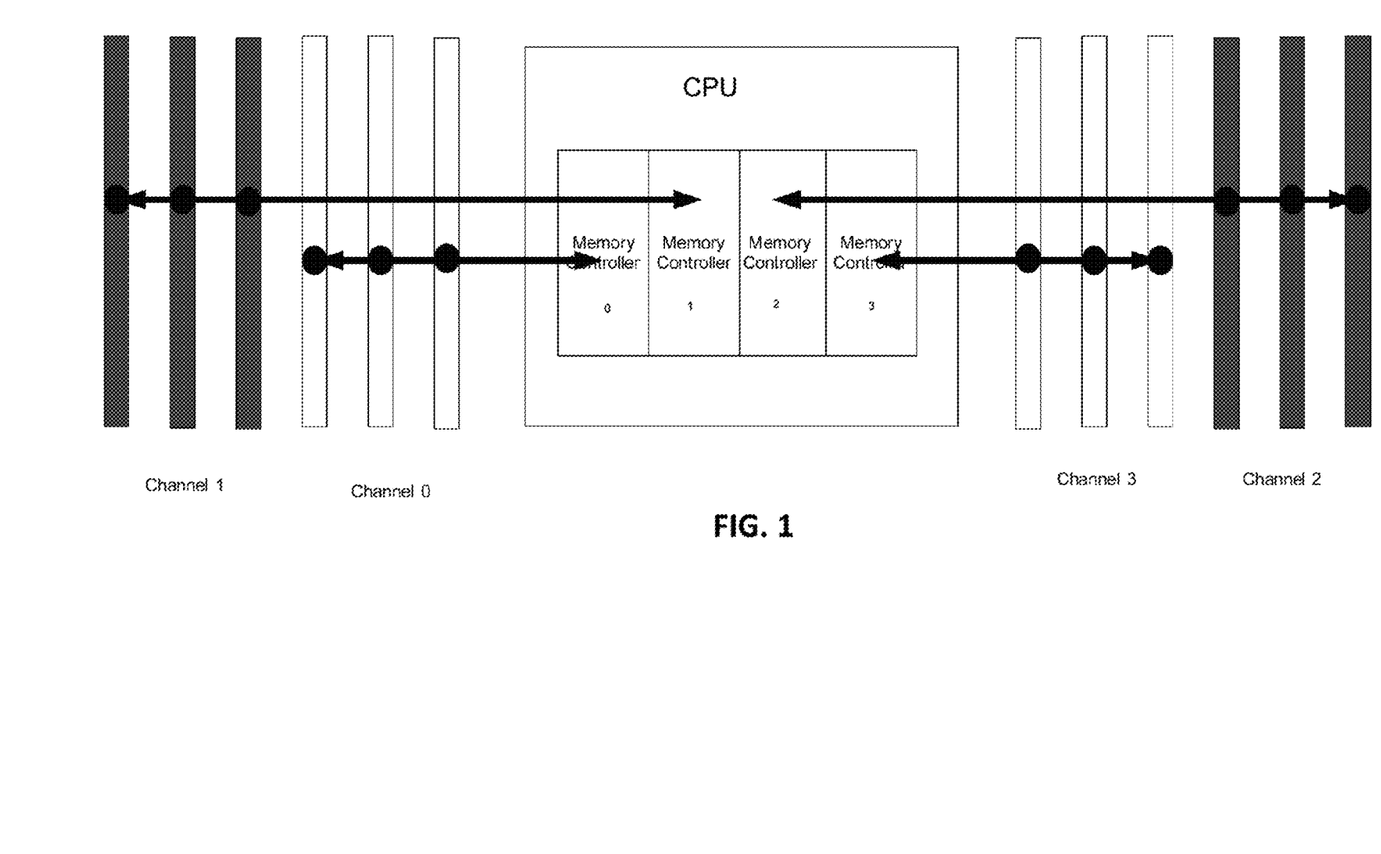
FIG. 1 is a simplified block diagram of a memory system according to an embodiment of the present invention.

FIG. 1 is a simplified block diagram of a memory system according to an embodiment of the present invention. In server memory system, one CPU can have multiple memory controllers to increase memory capacity. For example, in FIG. 1, one CPU has 4 memory controllers, which drive 4 memory channels. Each memory controller drives multiple memory DIMM modules. For example, in FIG. 1, each memory controller drives 3 DIMM modules.

Figure 2:
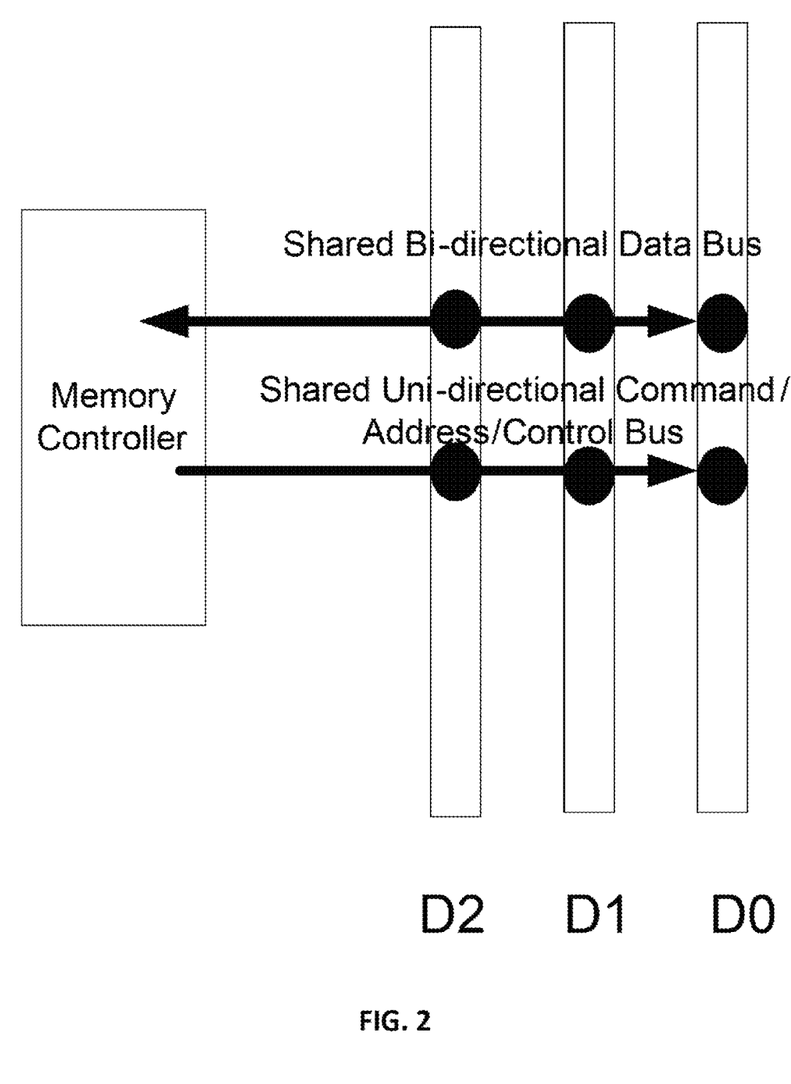
FIG. 2 is a simplified diagram of a memory module according to an embodiment of the present invention.

FIG. 2 is a simplified diagram of a memory module according to an embodiment of the present invention. In each memory channel, all data bus and command/address/control bus are shared among multiple memory modules. For example, in FIG. 2, the data bus and command/address/control bus are shared among three (3) memory modules D2, D1, and D0. The shared data bus creates challenge for the signal transmitted on the bus. In an example, the extra stubs on the bus create the reflections, which will change the signal shape and cause difficulty for the receiver to receive the data correctly, especially when data rate is increased to DDR3 and DDR4 speed range.

Figure 3:
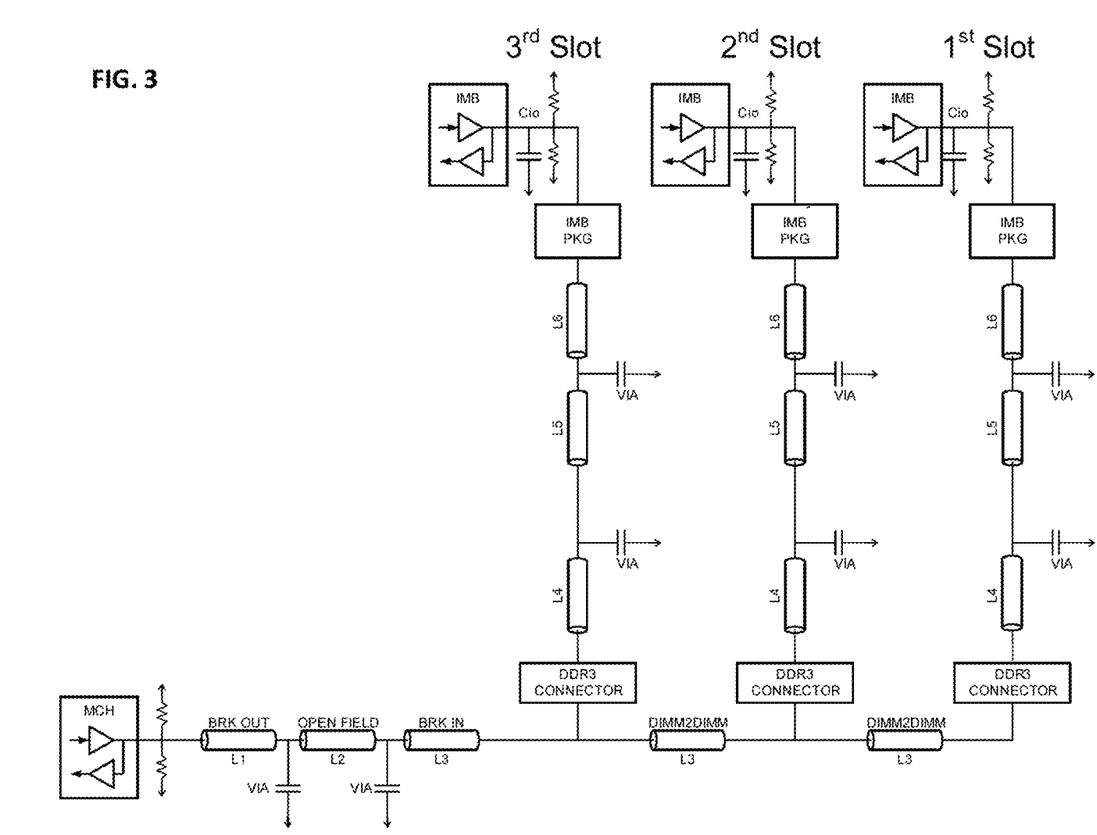
FIG. 3 is a simplified diagram of a memory channel according to an embodiment of the present invention.

FIG. 3 is a simplified diagram of a memory channel according to an embodiment of the present invention. For example, a 3DPC configuration channel is shown in term of transmission lines and discontinuities caused by the capacitors such as vias, silicon I/O caps, etc. in FIG. 3. From the channel diagram in FIG. 3, we can see that the 3DPC memory channel is in daisy-chain structure and use multi-drop bus, which introduces discontinuities at each DIMM connector. From the principle of signal transmission along the transmission lines, each discontinuity will introduce signal reflection and hence distort the signal quality at the receiver.

On each DIMM, there is an extra stub from the DIMM connector gold finger to the memory buffer receiver. This extra stub introduces a large discontinuity at DIMM connector and hence causes reflections.

Figure 4:
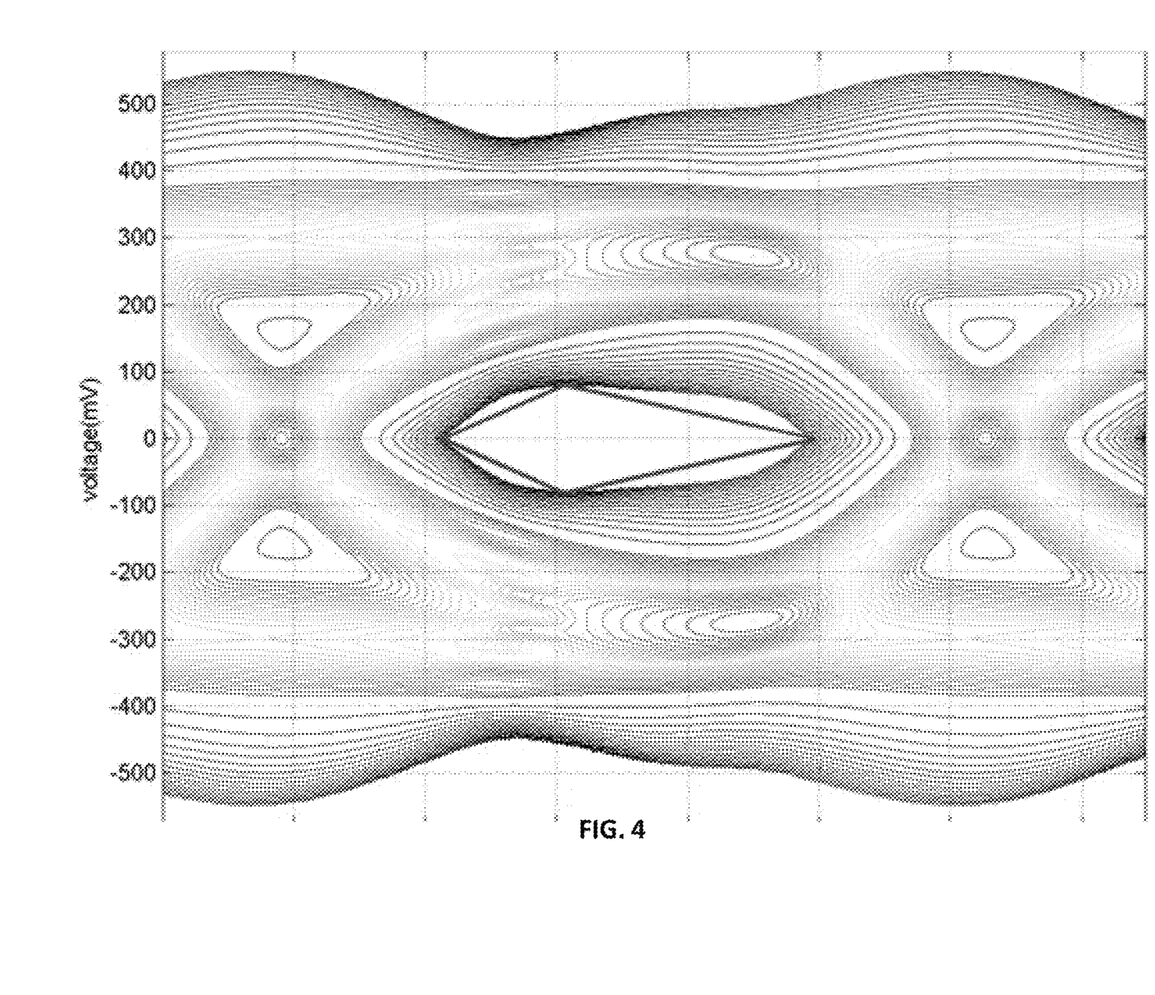
FIG. 4 is a simplified illustration of an eye scan having a distorted eye shifted in a first direction according to an embodiment of the present invention.
Figure 5:
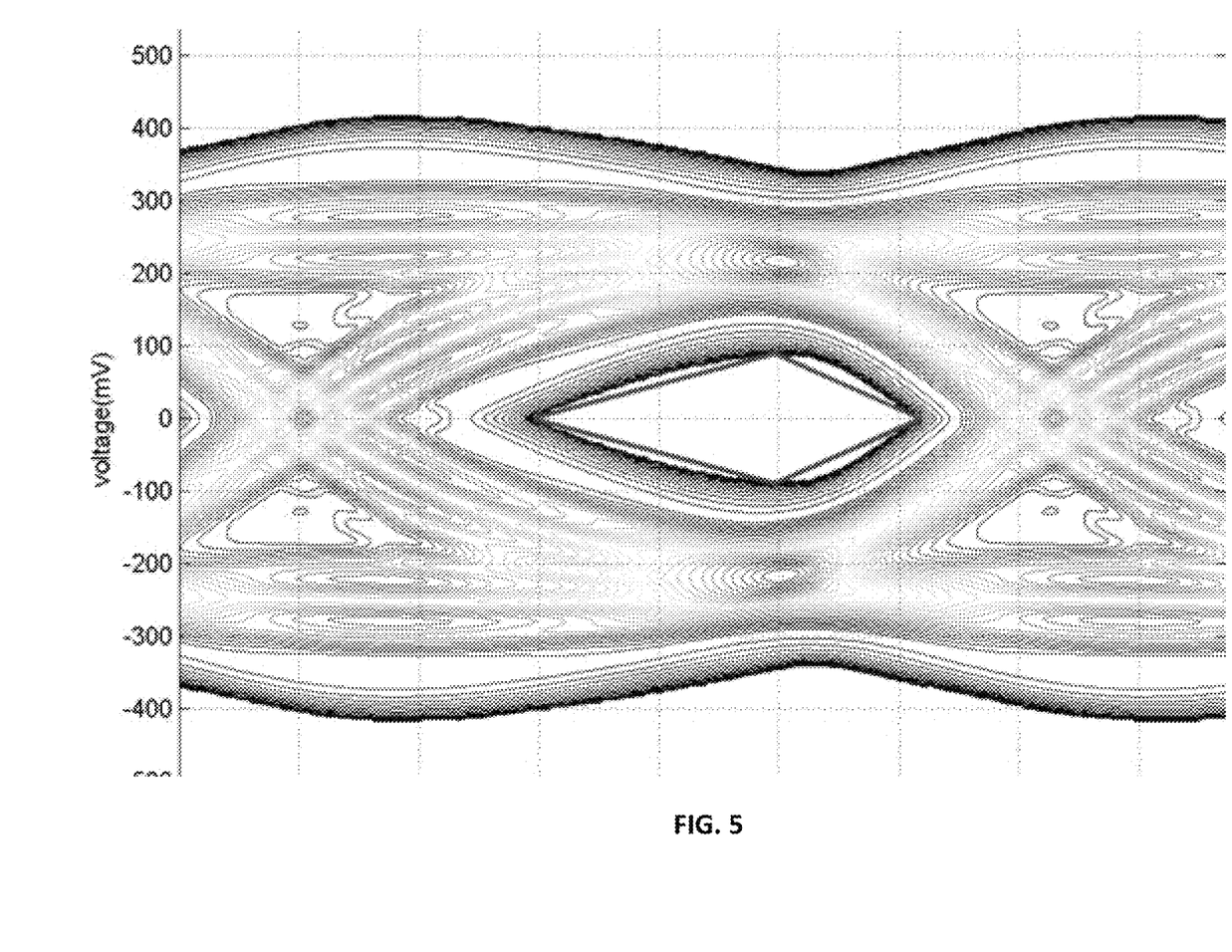
FIG. 5 is a simplified illustration of an eye scan having a distorted eye shifted in a second direction according to an embodiment of the present invention.

For example, when writing to DIMM2, the signal also propagates to DIMM1 and DIMM0. The reflections coming from DIMM1 and DIMM0 plus the reflections from the DIMM2 memory buffer are combined together and distort the eye shape at the receiver of DIMM2. The net effect of the distortion from the refection is the eye-shape is not symmetric around the middle of the eye opening. The largest vertical eye opening is either shifted to the left or right depending on the channel reflections. Two typical eye diagrams are shown in FIG. 4 and FIG. 5. FIG. 4 shows an eye distorted to the left and FIG. 5 shows an eye distorted to the right. As shown, FIG. 4 is a simplified illustration of an eye scan having a distorted eye shifted in a first direction according to an embodiment of the present invention. As shown, FIG. 5 is a simplified illustration of an eye scan having a distorted eye shifted in a second direction according to an embodiment of the present invention.

In a memory system, the data signal (DQ) is sampled with strobe signal (DQS) at the receiver of a DIMM device. During the memory initialization stage of a computing system, the Basic Input and Output System, commonly called "BIOS," trains a spatial position between DQ and DQS and the BIOS finds the best or desirable location for DQS to sample the DQ.

Figure 6A:
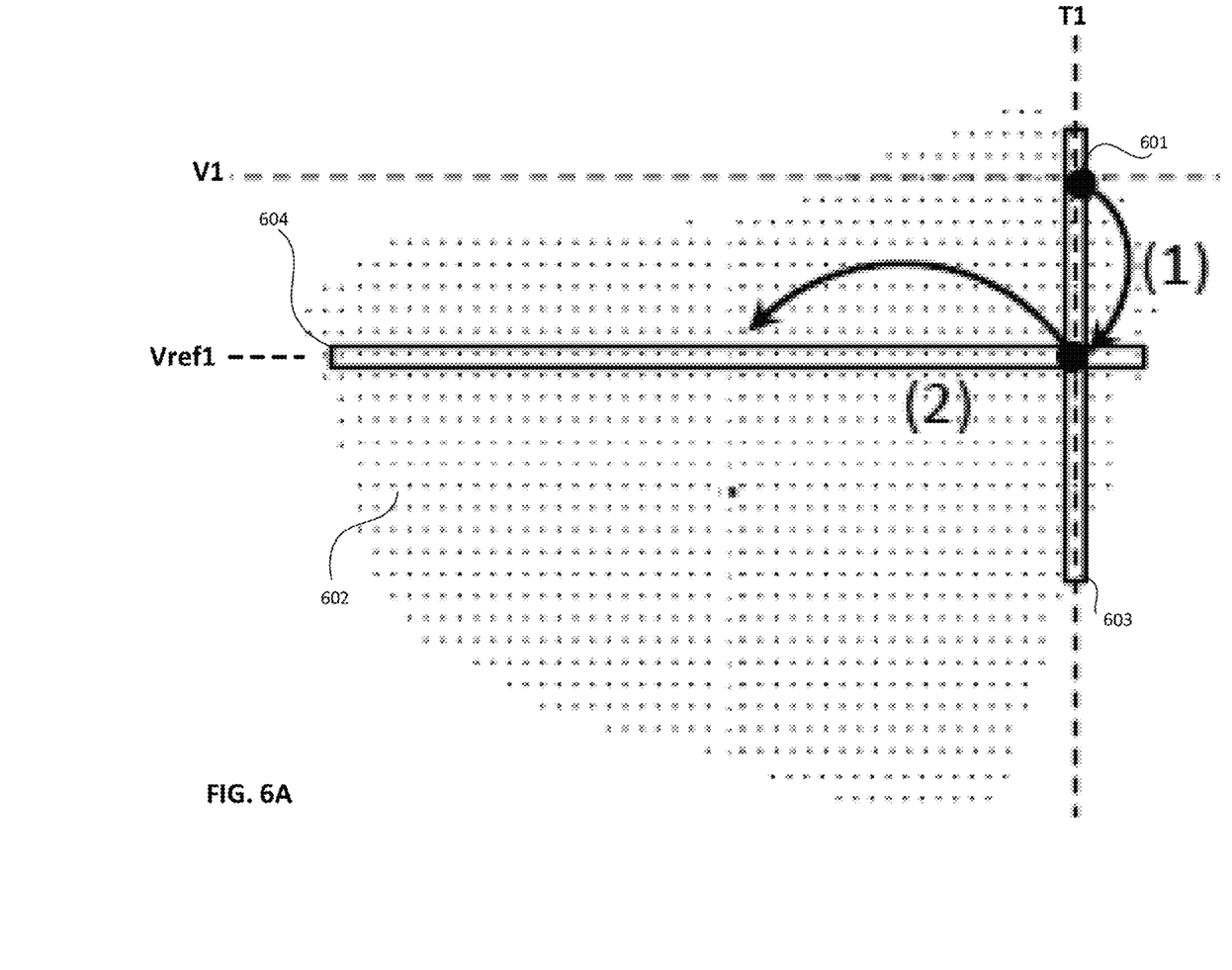
FIGS. 6A-D illustrate various stages of a method according to an embodiment.
Figure 6B:
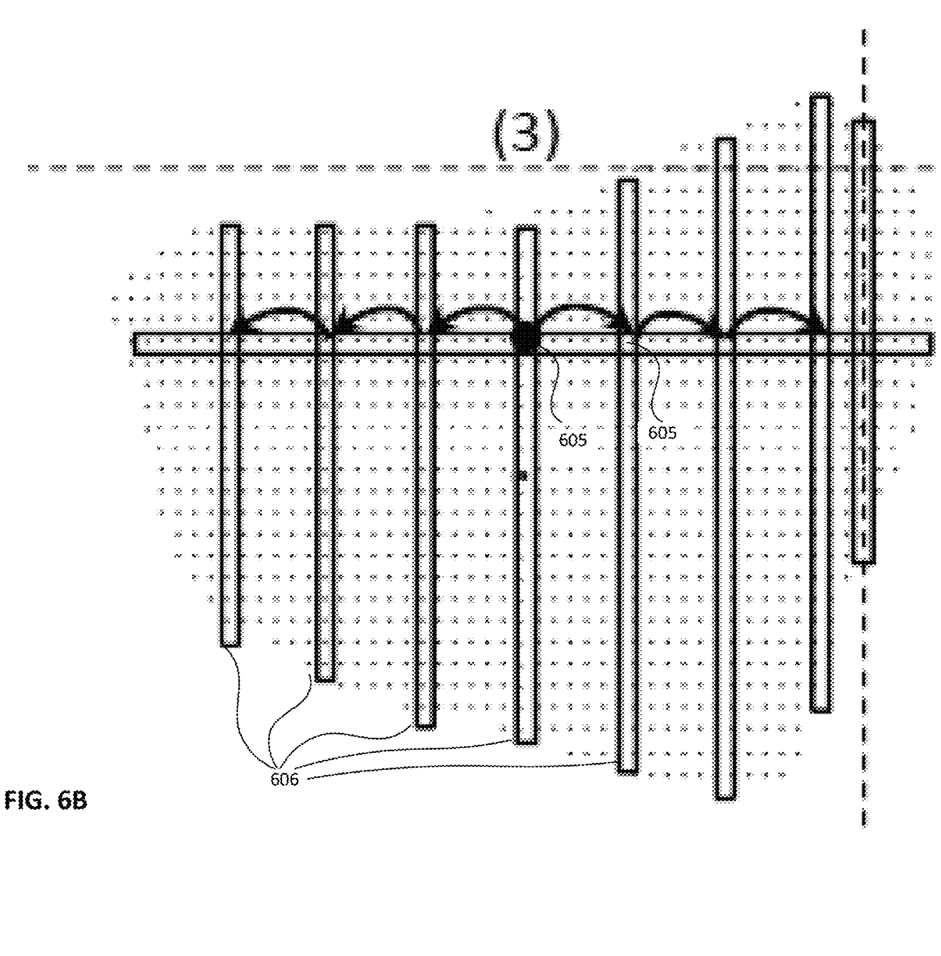
Figure 6C:
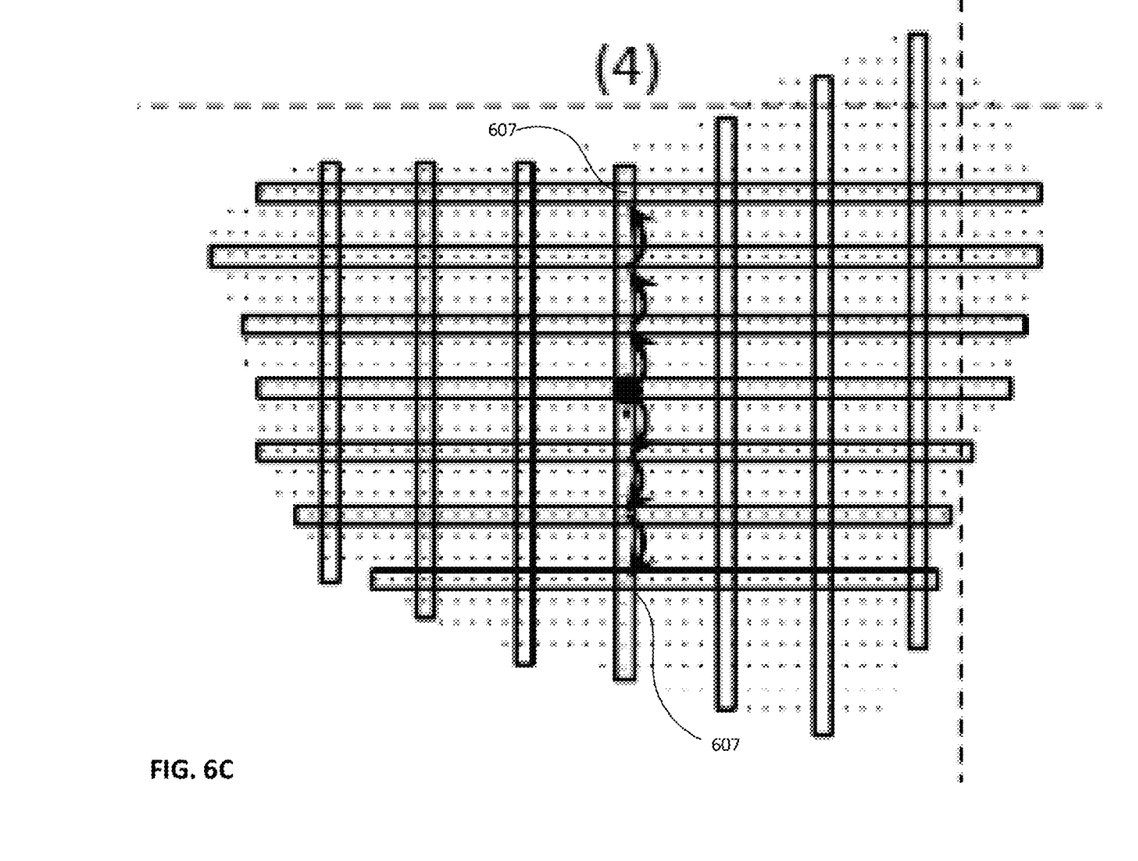
Figure 6D:
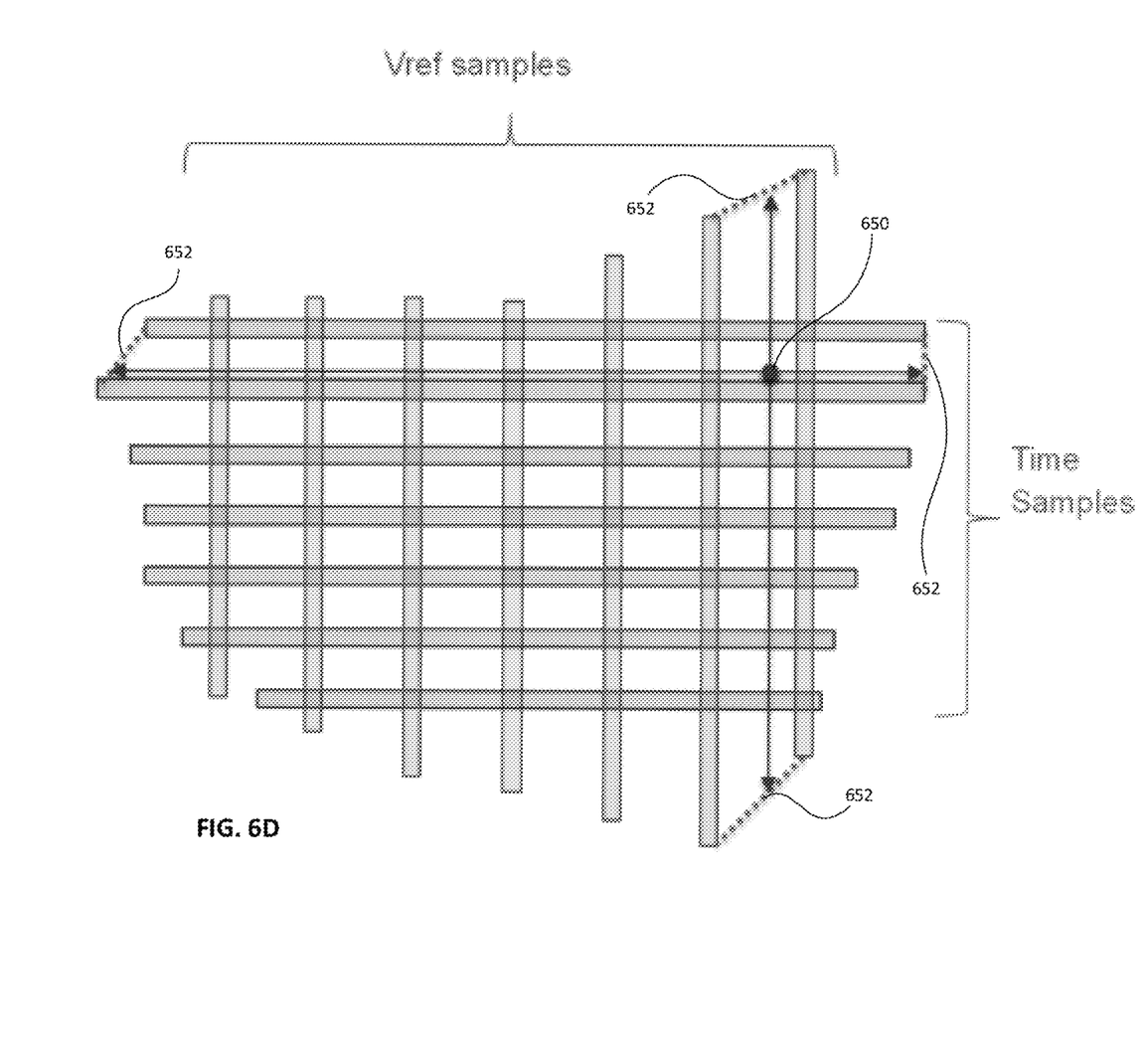
Figure 7:
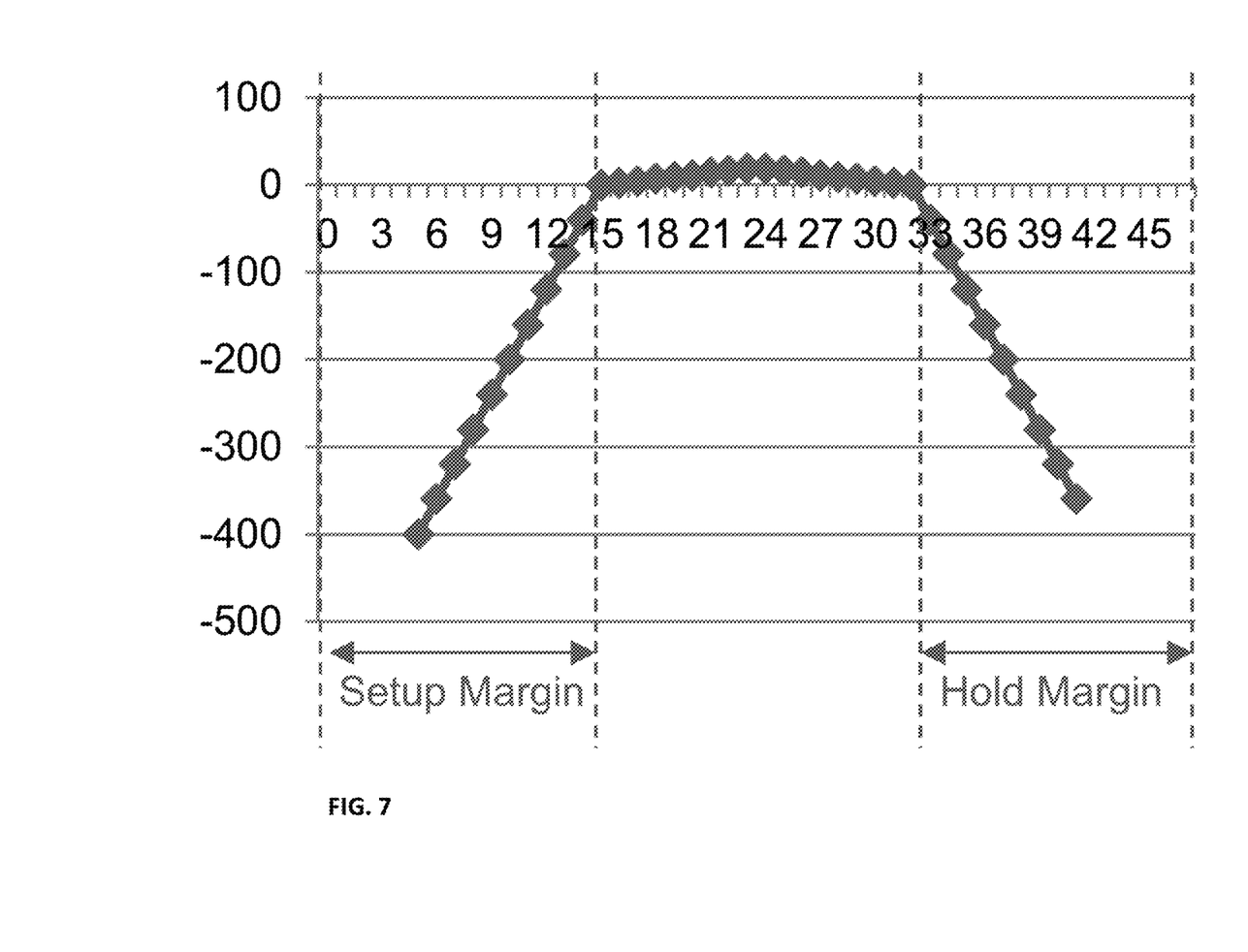
FIG. 7 illustrates generating a time function weight component of a series of sampled matrix points.

In an example, the BIOS trains the location of DQS relative to DQs follows, in reference to the FIGS. 6A-7.

Specifically, FIGS. 6A-D illustrate various stages in a process according to an embodiment. In particular, a methodology to sample Vref and a Time margin are as follows.

In a first step (1) of FIG. 6A, from an initial sampling point (T1, V1) 601 within the eye scan 602, a first reference voltage (Vref) representing a center of a first margin 603 between upper and lower boundaries of the eye, is determined.

In second step (2) also shown in FIG. 3A, a time margin 604 between a setup time and a hold time is then found by shifting the strobe signal along the time axis.

A third step (3) is shown in FIG. 6B. Here, the time margin is divided into a desired number of steps at a series of evenly-spaced points 605 (here seven). Then, the respective Vref margin 606 is taken at each of those time points by shifting the data signal along the voltage axis.

A fourth step (4) is shown in FIG. 6C. The Vref margin is divided into a certain number of steps at a series of evenly-spaced points 607 along the voltage axis. Then, the time margin is found at each of those Vref points.

In this manner, by sampling an initial point within an eye scan, and then breaking up a sequence of resulting voltage/time margins into equally spaced steps for further sampling, a matrix of (V, T) points can be constructed.

Certain points of the matrix may not lie on the sampling lines. The, the distance to the edges is approximated based on the four surrounding sampling lines. This is shown in FIG. 6D, where matrix point 650 does not lie on a sampling line, and its distance to the edges is extrapolated as a linear function 652 between the two adjacent sampling lines.

While the particular embodiment illustrated in FIGS. 6A-6D shows initial calculation of a Vref, followed by sampling spaced along the time dimension, this is not required. Approaches according to alternative embodiments could instead utilize a first reference point along the time dimension, followed by sampling spaced along the voltage dimension.

Thus according to an alternative embodiment, the Vref sampling does not need to go first, and the sequence can be implemented differently depending on how distorted the eyes are in a certain system. Also, steps 1) and 2) can be repeated one or more times to work in an eye system exhibiting significant distortion.

Once the matrix of (V, T) points is sampled according to the two-dimensional approach of FIGS. 6A-D, each point is assigned a value according to a time function f(t). As shown in FIG. 7, that value can depend upon how far it is to both ends of its time margin (here, defined between a Setup Margin and a Hold Margin).

If the point does not meet the time margin requirement, it is assigned a negative number by the time function f(t) component of the weighting. FIG. 7 shows that this particular f(t) sharply favors the center, making the slope to center small (flat).

A similar calculation is performed for a voltage function of the voltage dimension. Each voltage point is assigned a value according to a voltage function f(v), depending on how far it is to both ends of its Vref margin (e.g., as defined between a lower margin and an upper margin). If the particular point does not meet the voltage margin requirement, it is assigned a negative number.

The training in two-dimensions is achieved by calculating a total value of the weight w(t, v) of each point in the matrix, is the sum of f(t) and f(v): w(t, v)=f(t)+f(v). The point with the highest numerical value represents a new voltage and time reference accurately representing a center of the eye scan.

In an example, the eye scan algorithm can be implemented in the memory interface chip, memory device, memory controller. It usually needs Basic Input and Output System, common called "BIOS" assistance. During the system initialization, memory controller and memory devices negotiate with each other and determine the memory timing settings. This process is usually called memory interface training. This process is controlled by the memory reference code in the BIOS. The fast eye scan can be performed during the memory training process and implemented the training algorithms in the memory reference codes. During the training, the sampling strobe (DQS) signal is shifted relatively to the data signal (DQ) by the transmitter or receiver with a fractional step of a clock cycle (for example, $\frac{1}{128}$th of clock cycle). Then memory reference code will enable the memory controller memory built-in self test logics (BIST). This process is continued until one data unit interval is swept by the data strobe (DQS). By doing this, memory reference code will determine the eye opening by checking the memory BIST test results. For a fixed position between data strobe signal (DQS) and data signal (DQ), memory reference code will adjust the reference voltage of the receiver and then start the memory BIST test to determine the vertical eye opening. Memory reference code first shifts the reference voltage up from the default voltage level by a small voltage step (for example, 5 mV) and do a memory BIST test and record the test result. Memory reference code continues shifts the reference voltage up until the memory BIST test failure. This indicates the top of the opening eye in vertical direction. Next memory reference code shifts the reference voltage level down from the default voltage level by a small voltage step (for example, 5 mV) and until the memory BIST test fail. This indicates the bottom of the opening eye in vertical direction. By doing so, memory reference code can determine the vertical eye opening at a fixed sampling point.

As shown, the system includes a motherboard including a central processing unit (CPU) coupled to three DIMM connector slots. In an embodiment, the CPU has one memory controller, but can include multiple memory controllers. The memory controller shown has three DIMM slots, but the memory controller can have more than three slots. In this embodiment, each of the DIMM modules includes a memory buffer. However, those of ordinary skill in the art will recognize other variations, modifications, and alternatives.

In an example, the memory module, or DIMM module, includes a plurality of storage devices, such as DRAM devices, flash memory devices, and the like. In an embodiment, the DIMM module also includes a memory buffer device, which can include a single chip or multiple chips. This DIMM module having the memory buffer can be used in the DIMM slots shown in the memory system block diagram. Those of ordinary skill in the art will recognize other variations, modifications, and alternatives.

In an example, the memory buffer interface includes a memory buffer iSC, which is coupled to a plurality of DRAMs, a SATA FLASH controller, and a DIMM edge connector. In this embodiment, the SATA FLASH controller is also coupled a plurality of FLASH modules and can have a 2.1 Gbps data read speed and a 2.1 Gbps data write speed.

In a specific embodiment, the memory buffer interface can include a DDR-1600 interface between the memory buffer iSC and the plurality of DRAMs with a data transfer speed of greater than 115 Gbps. The memory buffer can also include a SATA-II interface between the memory buffer iSC and the SATA FLASH controller with a data transfer speed of 2.4 Gbps. Also, the memory buffer iSC and the DIMM edge connector can include an ADR pin 167 connection. Of course, there can be other variations, modifications, and alternatives.

In an example, the system includes a motherboard including a central processing unit (CPU) coupled to two memory buffers on the motherboard. Each of the memory buffers is coupled to two DIMM slots. Each of these DIMM slots can be applied with regular standard DIMM module.

In an embodiment, the CPU has one memory controller, but can include multiple memory controllers. The memory controller shown is coupled to two memory buffers, but can be coupled to more than two memory buffers. Each of the memory buffers shown is coupled to two DIMM slots, but each buffer can have more than two DIMM slots. In this embodiment, each of the memory buffers is configured on the motherboard. However, those of ordinary skill in the art will recognize other variations, modifications, and alternatives.

In an example, the buffer chip shown can represent the memory buffers any buffer chips. In an example, the buffer chip includes a storage controller. Again, there can be other variations, modifications, and alternatives.

In an example, the DRAM device includes a command/address receiver, a command decoder, a bank decoder, a column decoder, a plurality of banks, an I/O gating data mask, a read & write FIFO, an output DQ driver, and an input DQ receiver.

In an example, the plurality of banks is shown to have banks numbered from 0-7, but can have more banks. Each of the banks includes a row decoder, sense amplifiers, and a DRAM array. In an embodiment, the command receiver and decoder receives a command and address input and outputs signals to the bank decoder, the column decoder, and the row decoder of the plurality of banks. The sense amplifiers and the column decoder are coupled to the I/O gating data mask, which is coupled to the read & write FIFO. The FIFO is coupled to the input DQ receiver and the output DQ driver.

In a specific embodiment, the bus connecting the sense amplifiers and the I/O gating data mask can have a row width of 8192. Also, the bus between the I/O gating data mask can have an 8×10 width with a ⅛ data rate. For example, the bus can be 64 bits wide with a 200 MT/s data rate. The input and output DQ can be full 10 width with full data rates, which can be 8 bits wide with a data date of 1600 MT/s. Of course, there can be other variations, modifications, and alternatives.

In an example, the present method and system have variations. As an example, the transferring of information is provided at a data rate of 1333 MT/S, 1600 MT/S, 1866 MT/S, 2133 MT/S or above. In an example, the writing of data is provided during a BIOS operation. In an example, communicating is provided at a data rate of up to 1600 MBPS on the unidirectional command/address/control bus. In an example, transferring information at a data rate of up to 3200 MBPS on the bi-directional data bus. In an example, the memory controller and the plurality of DIMM devices are configured on a common substrate member.

It is to be appreciated that through the use of embodiments, a number of possible benefits may be achieved. For example, one such benefit is increased accuracy of eye analysis.

In particular, a memory channel optimization method sets the target of the Bit Error Rate (BER) performance in terms of voltage and timing requirements, applying the constrained target during system training. This is more accurate than merely training the system to find a center of the eye in one-dimension, which does not necessarily minimize the BER.

Thus, according to embodiments, memory channel performance can be optimized in a voltage stressed channel to determine the maximum voltage open point. Then, the voltage margin can be reduced until it meets the minimum timing. Such an approach maximizes the voltage margin while meeting the minimum requirement of timing specification.

Embodiments similarly allow optimizing the memory channel performance in a timing stressed channel. The maximum time open point is found, and then the timing margin is reduced until it meets the minimum voltage specification. This maximizes the timing margin while meeting the minimum requirement of voltage specification.

For a memory channel stressed in both timing and voltage, channel optimization according to an embodiment serves to map out a two-dimensional contour of the eye scan.

Embodiments are thus drawn to memory channel optimization that applies both time and voltage targets, and adjusts the sample point to minimize the Bit Error Rate (BER) based on the 2-D contour of the eye scan, rather than merely finding the center of timing or voltage window. There are other benefits as well.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method of operating a memory system during a memory initialization process to train a position between a data signal with a strobe signal at a receiver location of one of a plurality of DIMM devices, the method comprising:

transferring information between a memory controller coupled to a CPU of a host computer to and from a least three DIMM devices numbered from DIMM D0, DIMM D1, and DIMM D2 using a common bi-direction data bus, the bi-directional data bus being coupled between a data interface from the memory controller to a D0 data interface, a D1 data interface, and a D2 data interface;

communicating address information and control information from the memory controller to one or more of the three DIMM devices numbered from DIMM D0, DIMM D1, and DIMM D2 using a uni-directional command/address/control bus configured between the memory controller and the three DIMM devices;

writing information to D2 by transferring data from the memory controller to D2 using the common bi-directional interface data bus; causing a signal propagation from the writing of the information to D2 to either or both D1 or D0;

subjecting the D2 interface to a reflection caused by the signal propagation from either or both D0 or D1 to cause an introduction of distortion into a shape of an eye opening characterizing a signal at the receiver of D2;

reading information from one of DIMM modules by transferring data from the DIMM module to the memory controller using the common bi-directional interface data bus;

causing a signal propagation from the reading of the information from the DIMM module to one or more of the other DIMM modules sharing the same common bi-directional data bus;

subjecting the D2 data interface to a reflection caused by the signal propagation from one or more of the other DIMM modules sharing the same common bi-directional data bus to cause an introduction of distortion into a shape of the eye opening characterizing a signal at the receiver of memory controller interface;

determining spatial regions on the eye opening characterized by sampling a voltage and time at an initial point, identifying a first margin within eye boundaries along a first dimension by shifting a DQS or a DQ position and running memory built-in self test (BIST) engines and the results of BIST tests, determining a first reference at a center of the first margin, identifying a second margin within eye boundaries at the first reference along a second dimension by shifting the DQS or DQ position and running memory built-in self test (BIST) engines and the results of BIST tests, and determining a first plurality of time and voltage points evenly spaced along the second margin, and identifying respective margins for each of the first plurality of voltage and time points within the respective margins along the first dimension by shifting the DQS or DQ position and running memory built-in self test (BIST) engines and the results of BIST tests, and determining a second plurality of time and voltage points evenly spaced along the respective margins;

calculating a value for each of the first plurality of voltage and time points and the second plurality of voltage and time points based upon a distance from an edge of the respective margins; and identifying a time and voltage point corresponding to a middle point of the eye based upon a highest value.

2. The method of claim 1 wherein the DIMM device is a DDR3 or DDR 4.

3. The method of claim 1 wherein transferring is provided at a data rate of 1333 MT/S, 1600 MT/S, 1866 MT/S, 2133 MT/S or above.

4. The method of claim 1 wherein the writing is provided during a BIOS operation.

5. The method of claim 1 wherein the communicating is provided at a data rate of up to 1600 MBPS on the unidirectional command/address/control bus.

6. The method of claim 1 wherein the transferring information at a data rate of up to 3200 MBPS on the bi-directional data bus.

7. The method of claim 1 wherein the memory controller and the plurality of DIMM devices are configured on a common substrate member.

8. The method of claim 1 wherein the memory system is provided in one of a network appliance, a computer storage systems, a computer server, a hand held computing device, a portable computing device, a switch, a router, or a gateway.

9. The method of claim 1 wherein:
the first dimension comprises voltage;
the edge boundary along the first dimension is defined between a lower margin and an upper margin;
the first margin is determined by shifting the DQ position; and
the first reference comprises a first reference voltage.

10. The method of claim 1 wherein:
the first dimension comprises time;
the edge boundary along the first dimension is defined between a setup margin and a hold margin;
the first margin is determined by shifting the DQS position; and
the first reference comprises a first reference time.

11. The method of claim 1 wherein:
the common bi-directional data bus is voltage stressed;
the first reference comprises a maximum voltage open point; and
the DQS position is shifted until a minimum timing requirement is met.

12. The method of claim 1 wherein:
the common bi-directional data bus is timing stressed;
the first reference comprises a maximum time open point; and
the DQ position is shifted until a minimum voltage specification is met.

13. The method of claim 1 wherein calculating the value comprises:
calculating a voltage function;
calculating a time function; and
summing the voltage function and the time function.

14. A method of operating a memory system during a memory initialization process to train a position between a data signal with a strobe signal at a receiver location of one of a plurality of DIMM modules, the method comprising:

transferring information between a memory controller coupled to a CPU of a host computer to and from multiple DIMM modules using a common bi-direction data bus, the bi-directional data bus being coupled between a data interface from the memory controller to multiple memory interfaces coupled to the DIMM modules;

communicating address information and control information from the memory controller to one or more of the multiple DIMM modules using a uni-directional command/address/control bus configured between the memory controller and the multiple DIMM modules;

writing information to one of the DIMM modules by transferring data from the memory controller to the DIMM module using the common bi-directional interface data bus;

causing a signal propagation from the writing of the information to the DIMM module to other DIMM modules sharing the common bi-directional interface data bus;

subjecting an interface of a target DIMM module to a reflection caused by the signal propagation from other DIMM modules sharing the common bi-directional data bus to cause an introduction of distortion into a shape of an eye characterizing a signal at the receiver of the target DIMM module;

reading information from one of DIMM modules by transferring data from the one DIMM module to the memory controller using the common bi-directional interface data bus;

causing a signal propagation from the reading of the information from the one DIMM module to other DIMM modules sharing the same data bus;

subjecting the interface of the target DIMM module to a reflection caused by the signal propagation from other DIMM modules sharing the common bi-directional data bus to cause an introduction of distortion into a shape of an eye characterizing a signal at the receiver of memory controller interface determining spatial regions on the eye characterized by sampling a voltage and time at an initial point, identifying a first margin within eye boundaries along a first dimension by shifting a DQS or a DQ position and running memory built-in self test (BIST) engines and the results of BIST tests, determining a first reference at a center of the first margin, identifying a second margin within eye boundaries at the first reference along a second dimension by shifting the DQS or DQ position and running memory built-in self test (BIST) engines and the results of BIST tests, and determining a first plurality of time and voltage points evenly spaced along the second margin, and identifying respective margins for each of the first plurality of voltage and time points within the respective margins along the first dimension by shifting the DQS or DQ position and running memory built-in self test (BIST) engines and the results of BIST tests, and determining a second plurality of time and voltage points evenly spaced along the respective margins;

calculating a value for each of the first plurality of voltage and time points and the second plurality of voltage and time points based upon a distance from an edge of the respective margins; and identifying a time and voltage point corresponding to a middle point of the eye based upon a highest value.

15. The method of claim 14 wherein:
the first dimension comprises voltage;
the edge boundary along the first dimension is defined between a lower margin and an upper margin;
the first margin is determined by shifting the DQ position; and
the first reference comprises a first reference voltage.

16. The method of claim 14 wherein:
the first dimension comprises time;
the edge boundary along the first dimension is defined between a setup margin and a hold margin;
the first margin is determined by shifting the DQS position; and
the first reference comprises a first reference time.

17. The method as in claim 14 wherein:
the common bi-directional data bus is voltage stressed;
the first reference comprises a maximum voltage open point; and
the DQS position is shifted until a minimum timing requirement is met.

18. The method of claim 14 wherein:
the common bi-directional data bus is timing stressed;
the first reference comprises a maximum time open point; and
the DQ position is shifted until a minimum voltage specification is met.

19. The method of claim 14 wherein calculating the value comprises:
calculating a voltage function;
calculating a time function; and
summing the voltage function and the time function.

20. The method of claim 14 wherein the memory system is provided in one of a network appliance, a computer storage systems, a computer server, a hand held computing device, a portable computing device, a switch, a router, or a gateway.

* * * * *